United States Patent
Chen et al.

(10) Patent No.: US 10,110,370 B2
(45) Date of Patent: Oct. 23, 2018

(54) WIRELESS SYNCHRONIZATION OF MM-WAVE ARRAYS

(71) Applicant: William Marsh Rice University

(72) Inventors: Charles Chen, Houston, TX (US); Aydin Babakhani, Houston, TX (US)

(73) Assignee: William Marsh Rice University, Houston, TX (US)

( * ) Notice: Subject to any disclaimer, the term of this patent is extended or adjusted under 35 U.S.C. 154(b) by 0 days.

(21) Appl. No.: 15/156,965

(22) Filed: May 17, 2016

(65) Prior Publication Data

US 2016/0380754 A1 Dec. 29, 2016

Related U.S. Application Data

(60) Provisional application No. 62/163,031, filed on May 18, 2015.

(51) Int. Cl.
*H04B 1/38* (2015.01)
*H04L 7/00* (2006.01)
(Continued)

(52) U.S. Cl.
CPC ......... *H04L 7/0079* (2013.01); *H03B 5/1852* (2013.01); *H03L 7/24* (2013.01); *H04L 7/033* (2013.01); *H04B 1/40* (2013.01)

(58) Field of Classification Search
CPC ......... H04L 7/0079; H04L 7/033; H03B 5/24; H03L 7/24; H04B 1/40
See application file for complete search history.

(56) References Cited

U.S. PATENT DOCUMENTS

| | | | |
|---|---|---|---|
| 2004/0095287 A1* | 5/2004 | Mohamadi | H01Q 1/36 343/824 |
| 2004/0246176 A1* | 12/2004 | Mohamadi | H01Q 3/22 342/372 |

(Continued)

FOREIGN PATENT DOCUMENTS

WO    WO-2015/134705 A2    9/2015

OTHER PUBLICATIONS

Assefzadeh, M.M.; Babakhani, A., "An 8-psec 13dBm peak EIRP digital-to-impulse radiator with an on-chip slot bow-tie antenna in silicon," Microwave Symposium (IMS), 2014 IEEE MTT-S International, vol., no., pp. 1,4, Jun. 1-6, 2014.

(Continued)

*Primary Examiner* — Nguyen Vo
(74) *Attorney, Agent, or Firm* — Dickinson Wright PLLC; Ross Spencer Garsson; Mark E. Scott

(57) ABSTRACT

Systems and methods providing wireless synchronization of wave arrays may include an antenna that receives a wireless injection signal and another antenna that radiates a locked wave signal corresponding to the injection signal. In some embodiments, these systems may also provide a low noise amplifier, voltage controlled oscillator (VCO), buffer amplifier(s), phase shifter, and/or multi-stage amplifier. In some embodiments, the injection signal may be provided on an even harmonic, and the intended transmission frequency signal is on an odd harmonic of the locked signal. The substrate thickness may be designed to radiate electromagnetic waves in odd harmonics of the locked signal. In yet another embodiment, polarization of a receiving antenna may be orthogonal to a transmitter antenna.

25 Claims, 10 Drawing Sheets

(51) Int. Cl.
*H04L 7/033* (2006.01)
*H03L 7/24* (2006.01)
*H03B 5/18* (2006.01)
*H04B 1/40* (2015.01)

(56) References Cited

U.S. PATENT DOCUMENTS

| | | | | |
|---|---|---|---|---|
| 2005/0190821 A1* | 9/2005 | Fujii | H04B 7/15535 | 375/211 |
| 2007/0159407 A1* | 7/2007 | Bolle | H01Q 3/267 | 343/853 |
| 2008/0320293 A1* | 12/2008 | Rofougaran | G06F 15/7867 | 713/1 |
| 2009/0088113 A1* | 4/2009 | Marsili | H04B 1/7136 | 455/260 |
| 2010/0188304 A1* | 7/2010 | Clymer | H01Q 1/185 | 343/753 |
| 2011/0110439 A1* | 5/2011 | Miyaoka | H04B 1/0475 | 375/259 |
| 2012/0235689 A1* | 9/2012 | Jau | A61B 5/0205 | 324/629 |
| 2013/0050015 A1* | 2/2013 | Black | H01L 27/14603 | 342/175 |
| 2013/0281029 A1* | 10/2013 | Lee | H03D 7/12 | 455/73 |
| 2014/0159971 A1* | 6/2014 | Hall | H01Q 1/243 | 343/745 |
| 2016/0204784 A1* | 7/2016 | Trotta | H01Q 3/30 | 342/354 |
| 2016/0223669 A1 | 8/2016 | Assefzadeh et al. | | |
| 2016/0277078 A1* | 9/2016 | Trotta | H04B 7/0413 | |
| 2016/0344108 A1 | 11/2016 | Assefzadeh et al. | | |

OTHER PUBLICATIONS

Ruonan Han; Afshari, E., "A 260GHz broadband source with 1.1mW continuous-wave radiated power and EIRP of 15.7dBm in 65nm CMOS," Solid-State Circuits Conference Digest of Technical Papers (ISSCC), 2013 IEEE International, vol., no., pp. 138,139, Feb. 17-21, 2013.

Kun-Hin To; Trivedi, V.P., "A 76-81GHz transmitter with 10dBm output power at 125° C. for automotive radar in 65nm bulk CMOS," Custom Integrated Circuits Conference (CICC), 2011 IEEE, vol., no., pp. 1,4, Sep. 19-21, 2011.

Jiashu Chen; Niknejad, A.M., "A compact IV 18.6dBm 60GHz power amplifier in 65nm CMOS," Solid-State Circuits Conference Digest of Technical Papers (ISSCC), 2011 IEEE International, vol., no., pp. 432,433, Feb. 20-24, 2011.

Sengupta, K.; Hajimiri, A., "A 0.28THz 4×4 power-generation and beam-steering array," Solid-State Circuits Conference Digest of Technical Papers (ISSCC), 2012 IEEE International, vol., no., pp. 256,258, Feb. 19-23, 2012.

Floyd, B.A.; Chih-Ming Hung; O, K.K., "Intra-chip wireless interconnect for clock distribution implemented with integrated antennas, receivers, and transmitters," Solid-State Circuits, IEEE Journal of, vol .37, No. 5, pp. 543,552, May 2002.

N. G. Alexopoulos, P. B. Katehi, and D. B. Rutledge, "Substrate optimization for integrated circuit antennas," in Proc. IEEE MH-S Int. Microwave Symp. Dig., 1982, vol. 82, pp. 190-192.

C. Chen and A. Babakhani, "Wireless synchronization of mm-wave arrays in 65nm CMOS," 2015 IEEE Custom Integrated Circuits Conference (CICC), San Jose, CA, 2015, pp. 1-4.

* cited by examiner

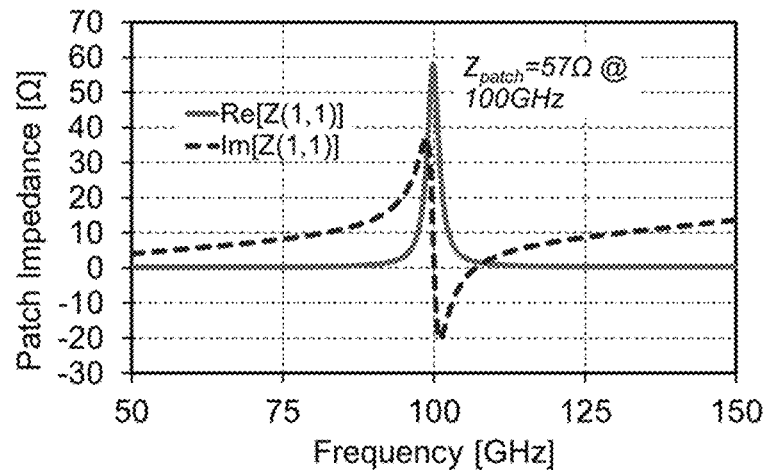
FIG. 6
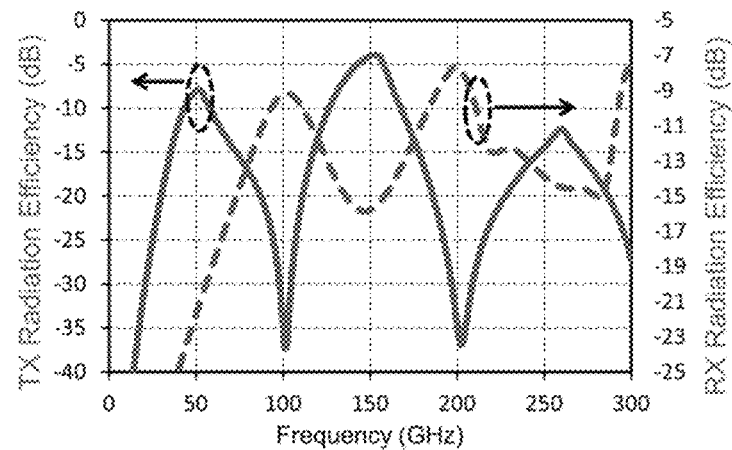
FIG. 7
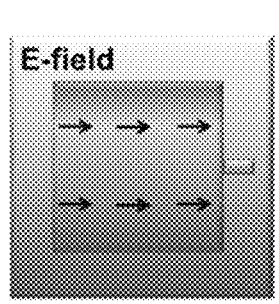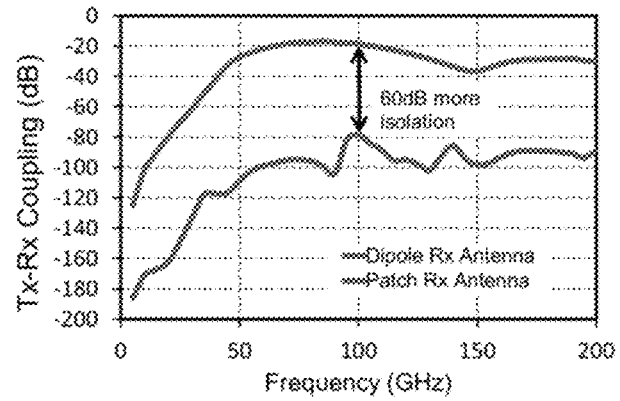
FIGS. 8A-8B

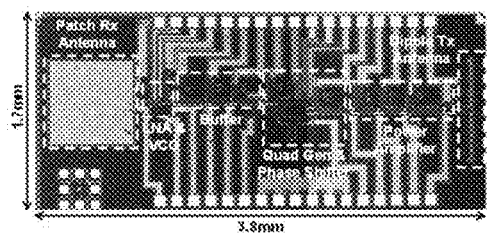
FIG. 16A
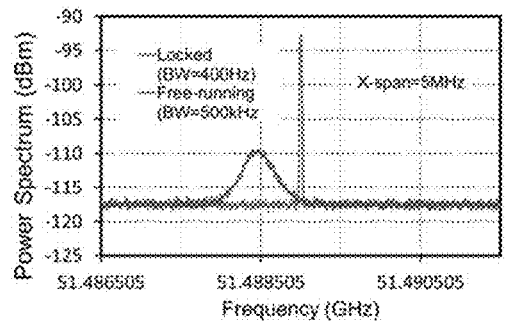
FIG. 17A
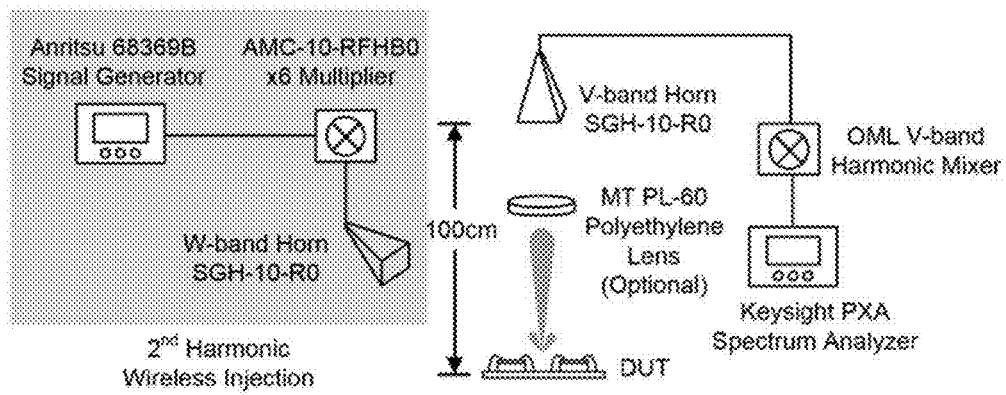
FIG. 16B
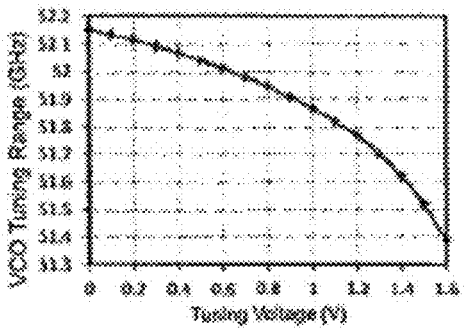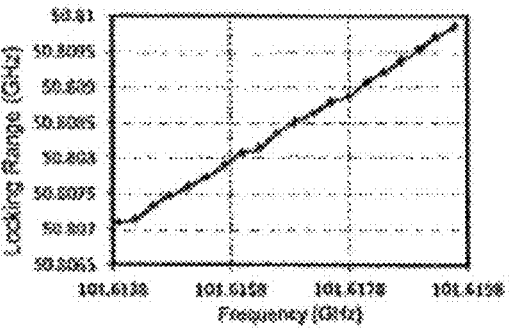
FIG. 17B-17C

|  | ISSCC 2014 | This work |
| --- | --- | --- |
| Locking Mechanism | Incoherent | Wireless Injection |
| Silicon Lens | Yes | No |
| Multi-chip spatial combining | No | Yes |
| Max. Chip Spacing | N/A | 13cm |
| Architecture | CW | CW |
| Frequency (GHz) | 530 | 100/50 |
| Power Consumption (mW) | 156 | 330 |
| Die Area (mm$^2$) | 4.2 | 6.46 |
| Process | 90nm SiGe | 65nm CMOS |

FIG. 24

WIRELESS SYNCHRONIZATION OF MM-WAVE ARRAYS

RELATED APPLICATIONS

This application claims the benefit of U.S. Provisional Patent Application No. 62/163,031 filed on May 18, 2015, which is incorporated herein by reference.

STATEMENT REGARDING FEDERALLY SPONSORED RESEARCH

This invention was made with government support under Grant No. N66001-12-1-4214 from the Department of Defense, SPAWAR Systems Center (SSC) Pacific. The government has certain rights in the invention.

FIELD OF THE INVENTION

This invention relates to wireless synchronization of wave arrays.

BACKGROUND OF INVENTION

CMOS-based mm-wave transceivers have received great attention in recent years. The promise of integrating mm-wave transceivers with commercial electronics opens up opportunities in wireless communication, automotive, medical, and security industries, to name a few. Prior research demonstrated successful functionality of integrated mm-wave transceivers. Unfortunately, due to the lack of a locking mechanism, these transmitters were limited to single-chip operation without reaping the potential benefits of a coherent multi-chip system with widely-spaced elements. Challenges for a single-chip mm-wave system include the limited amount of power generated and the low pattern directivity due to the small size of the on-chip antennas.

In order to achieve coherency in a multi-chip system, transmitters have employ locking through a wired connection, either in the form of a phase-locked loop for continuous-wave systems, or a digital square-wave trigger signal for pulsed systems. Unfortunately, the wired connections limit the scalability of the array and are not suitable for building synchronous arrays via mobile objects such as satellites, UAVs, or airborne systems. A wireless locking architecture can resolve this issue. An optical signal generated by a free-space laser locks the on-chip oscillator was contemplated in other work. However, the narrow beamwidth of the laser limits the operation angle and requires high-precision alignment, making it unsuitable for low-cost, mobile applications. In contrast, mm-wave wireless locking exhibits wider operation angle. Other work has also demonstrated the possibility of generating a 1.875 GHz local clock signal using a 15 GHz wireless signal. However, the range of operation in such work was limited to a few centimeters, and no radiation or spatial combining was performed.

Systems and methods providing wireless synchronization of a mm-wave array with high frequency stability wireless injection locking are discussed herein. The proposed systems and methods enable rapid scaling of the size of an array by eliminating the need for wires to connect the injection source to the widely-spaced chips. In addition, the proposed methodology can be used to build an array on a non-planar substrate or on a mobile platform.

SUMMARY OF INVENTION

In one embodiment, a transceiver provides an antenna that receives a wireless injection signal and another antenna radiates a locked wave signal corresponding to the injection signal. In some embodiments, the transceiver may also provide a low noise amplifier, voltage controlled oscillator (VCO), buffer amplifier(s), phase shifter, and/or multi-stage amplifier. In some embodiments, the injection signal may be provided on an even harmonic of the locked signal, and the transmission frequency is equal to the frequency of the locked signal or an odd harmonic of the locked signal. The thickness of the substrate may be designed to radiate electromagnetic waves in odd harmonics. In yet another embodiment, polarization of a receiving antenna may be approximately orthogonal to a transmitter antenna.

In some embodiments, the transceiver may be part of an array of wirelessly locked transceivers. In some embodiments, each of the transceivers in the array may be associated with distinct nonplanar regions of a substrate. In other embodiments, each of the transceivers in the array may be associated with a distinct mobile platform where the substrate associated with each transceiver is formed from disconnected pieces that may move relative to each other.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein:

FIG. 6 shows patch impedance ($\Omega$) vs. frequency (GHz) to demonstrate the simulated impedance of a receiving patch antenna tuned at 100 GHz;

FIG. 7 shows simulated radiation efficiencies of the transmitter dipole antenna (solid) and the receiver patch antenna (dashed);

FIGS. 8A-8B respectively show an orthogonal arrangement for the transmitter dipole antenna and the receiver patch antenna, and the reduction in the TX-RX coupling by using antennas that are orthogonal in frequency and polarization;

FIGS. 16A-16B respectively show a chip micrograph and measurement setup for wireless synchronization;

FIGS. 17A-17C respectively show spectrum of free-running vs. injection-locked oscillator, VCO tuning range (GHz) v. tuning voltage (V), and injection locking range (GHz) v. frequency (GHz);

FIG. 24 provides a performance comparison chart.

DETAILED DESCRIPTION

Figures 1A, 1B, 1C:
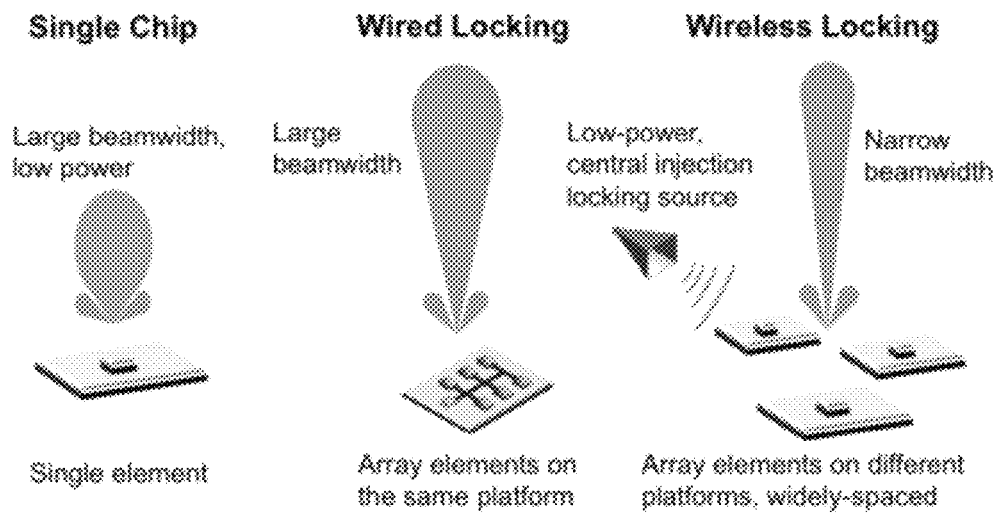
FIGS. 1A-1C respectively show schematics of a single chip, wired locking on the same platform, and wireless locking of widely-spaced chips on different platforms.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

As discussed previously, challenges for single chip wave system include limited power and low pattern directivity. In order to alleviate the power issue, on-chip and spatial power combining has been contemplated. As frequency increases in the mm-wave and THz regime (equal to or above 30 GHz and equal to or below 10 THz), spatial power combining becomes more effective as on-chip transmission-line based combining becomes too lossy. It has been shown that spatial power combining using multiple antennas on a single chip may boost the power level without significantly increasing the pattern directivity. This is because the size of a single chip is limited to a few wavelengths. Pattern directivity is important because it determines the angular resolution in imaging radars and affects the signal-to-noise ratio in wireless communication links. Due to the coherent combining, the signal-to-noise ratio at the receiver increases by a factor of $N^2$, where N is the number of elements in a transmitting array. One way to increase the pattern directivity, beam resolution, and the effective aperture size by several orders of magnitude is to make the spacing between array elements much larger than the wavelength. To enable coherent spatial combining and perform beam-steering, phase of the radiating signals from array elements should be locked with each other. However, this may requires precision timing synchronization among the array elements. As noted previously, experimentation with the possibility of generating a 1.875 GHz local clock signals using a 15 GHz wireless signal has been demonstrated, but operation was limited to a few millimeters, and no radiation or spatial combing was performed.

The advantages of a coherent multi-chip system and method discussed herein with widely-spaced elements include increased transmission power, narrower beamwidth and larger aperture size. For an N-element array that radiates $P_{rad}$ for each element, the effective isotropic radiated power (EIRP) can increase up to a factor of $N^2$. The increased transmission power extends the maximum detectable range in imaging radars, while narrower beamwidth and larger aperture size increase the angular resolution in imaging radars and enhance the security of the link in communication networks. The concept of the proposed designs is illustrated in FIG. 1, and FIG. 2 illustrates their corresponding beamwidth.

As a nonlimiting example regarding array spacing relative to wavelength, spacing between array elements of the transceivers provided in the array may be 100 times or greater than the wavelength. In some embodiments, the system of the transceivers of the system may operate at frequencies of 1 GHz or greater. In some embodiments, the system of the transceivers of the system may operate at frequencies of 10 GHz or greater. In some embodiments, the array of transceivers for the wireless locking system have an array separation of 100 mm or greater, 200 mm or greater, 300 mm or greater, 400 mm or greater, 500 mm or greater, or 600 mm or greater. For example, a spacing of 600 mm at 50 GHz (wavelength=6 mm) results in a narrow beam resolution of ~6 mm/600 mm=0.01 Rad=0.6 degrees. By designing efficient and orthogonal antennas, the proposed design demonstrates a transmission range of 100 cm or greater.

Systems and methods for wireless synchronization of a mm-wave array may eliminate the need for connecting wires between the array elements. The wireless synchronization system may provide an array of transceivers that each provide a receiving antenna, transmitting antenna, and/or voltage controlled oscillator (VCO). In some embodiments, the system may further provide a power amplifier, phase-shifter, and/or buffer amplifier(s). In some embodiments, a transceiver with an optimized substrate thickness is designed to radiate electromagnetic waves with a transmission frequency equal to the locked frequency, which is the frequency of the locked signal, or at odd harmonic(s) of the locked frequency, whereas the central injection source provides an injected signal in even harmonic(s) of the locked frequency. In some embodiments, a receiving antenna is approximately orthogonal to a transmitting antenna in polarization. As a nonlimiting example, the receiving antenna may be +/−15° from orthogonal to the transmitting antenna in polarization. In some embodiments, a transceiver is part of an array of wirelessly locked transceivers. An array spacing between transceivers in the array may be 100 times a wavelength of the radiated signal (or outputted locked signal) or greater. In some embodiments, a receiving antenna, VCO, phase shifter, and transmitting antenna or a transceiver may be present on a substrate. Further, a thickness of the substrate may be approximately equal to $0.07\lambda_0$, where $\lambda_0$ is wavelength in air. In some embodiments, each transceiver from the array of transceivers may be provided co-planar substrates and wirelessly synchronized. In some embodiments, the array of transceivers may be provided on a flexible substrate. In some embodiments, the transceiver from the array of transceivers may be provided on a nonplanar substrate, and further, each transceiver may be provided in distinct regions of a nonplanar substrate that do not share the same plane. In some embodiments, each transceiver from the array of transceivers may be provided on a distinct platform. These distinct platforms may be individual substrates that are disconnected pieces, or in other words, each transceiver is provided on a distinct substrate that is not shared with another transceiver. In some embodiments, the distinct platforms may be capable of moving relative to each other or are mobile platforms.

Various examples are discussed herein to demonstrate particular aspects of the present disclosure. It should be appreciated by those of ordinary skill in the art that the methods, parameters, and arrangements described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

As a nonlimiting example, wireless synchronization of a mm-wave array with frequency stability of 400 Hz using wireless injection locking may be provided, as well as spatial power combining of two widely-spaced chips with frequency stability of 6 kHz 3 dB bandwidth. The undesired multi-path feedback between receiving and transmitting on-chip antennas may be mitigated through orthogonal TX-RX radiation efficiencies, and the direct feedback between on-chip antennas may be alleviated using orthogonal radiation efficiency. The chip demonstrating such performance included two on-chip antennas, a power amplifier, a phase-shifter, buffer amplifiers, and a VCO. The chip was fabricated in a 65 nm CMOS process and occupied an area of 1.7 mm×3.8 mm. The wireless synchronization of a mm-wave array with 8 parts-per-billion (ppb) frequency stability using wireless injection locking was demonstrated. As noted previously, the improved systems and methods may provide scaling benefits, as well as use on a nonplanar substrate or mobile platform where the substrate is formed from disconnected pieces that may move relative to each other.

Figure 2:
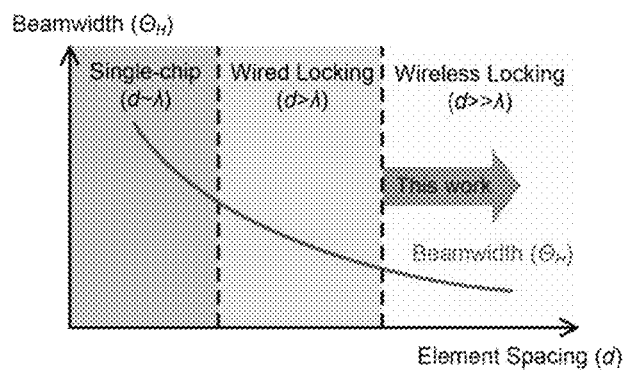
FIG. 2 shows the impact of element spacing (d) on beam width ($\theta_H$) for a single chip, wired locking, and wireless locking.

FIGS. 1A-1C respectively show schematics of a single chip, wired locking on the same platform, and wireless locking of widely-spaced chips on different platforms as discussed herein. As can be seen in FIG. 1A, the single element provides a large beam width and low power. FIG. 1B shows chips that are physically wired together for wired locking that produces a beam with a large beamwidth.

FIG. 1C is an illustrative embodiment of a widely-spaced array of transceivers providing wireless locking or a wireless locking system. A central injection locking source may provide an injection signal to widely-spaced chips or array of transceivers for wireless locking. Each of the chips provides a transceiver from the array, where the arrangement of the transceiver(s) is discussed in further detail below. The receiving antenna of at least one transceiver from the array of transceivers wirelessly receives an injection signal. In embodiments, providing power combining, the receiving antennas of two or more transceivers may wirelessly receive the injection signal. Further, the corresponding VCO is injection locked to the injection signal, and a transmitting antenna of the corresponding transceiver outputs a locked signal that corresponds to the injection signal. Each transceiver in the array may be separate distinct regions of a substrate or provided on distinct platforms. The widely-spaced chips may be wirelessly locked, despite being on different regions or platforms, to provide a beam with a narrow beamwidth. FIG. 2 shows the impact of element spacing (d) on beam width ($\theta_H$) for a single chip, wired locking, and wireless locking.

Concept of Widely-Spaced Arrays

The importance of element spacing is understood through the expression for beamwidth. For a large, broadside array system, the half-power beamwidth $\theta_H$, in radians, can be approximated by the following formula:

$$\theta_H \cong \frac{\lambda}{\pi d}\left(\frac{2.782}{N}\right) \qquad (1)$$

where N is the number of array elements, d is the spacing between array elements and λ is the wavelength at the frequency of operation. From this equation, it is evident that the beamwidth is inversely proportional to the array size (N×d). Wireless injection locking removes the area limitation of a single die by coherently locking the widely-spaced elements in a multi-chip system, making it possible to construct an array with narrow beamwidth that are not capable of being achieved with a system on single die. In general, the resolution of an imaging array is approximately equal to the half-power beamwidth of the antenna pattern. In reality, the resolution may be limited by the finite grating lobe rejection levels, which can be mitigated by methods such as adopting highly directive antennas or forming Chebyshev (equiripple) or binomial arrays (no sidelobes).

Figure 3:
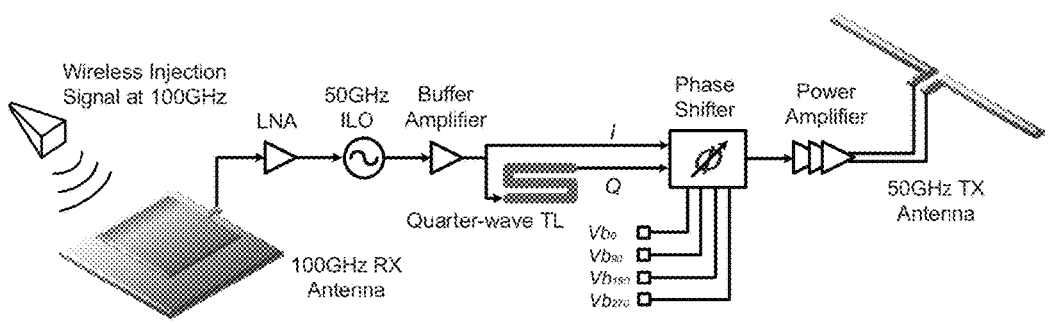
FIG. 3 shows a schematic of a transceiver architecture with wireless locking.

FIG. 3 shows a schematic of a transceiver architecture. A wireless locking system provides at least one transceiver providing the transceiver architecture discussed herein. In some embodiments, each transceiver provided in an array of transceivers for the wireless locking system may provide the transceiver architecture discussed herein. The transceiver provides a receiving antenna at the input that receives the wireless injection signal, an injection-locked VCO (IL-VCO) that generates a locked signal with frequency tone proportional to the frequency of the injection signal (e.g. 0.5, 1, 1.5, 2, or any suitable proportionality factor), and a transmitting antenna at the output that radiates the locked signal, such as locked mm-wave signal. The receiving and transmitting antennas can be any suitable planar antenna, such as, but not limited to, a dipole antenna, a patch antenna, an slot antenna, a bow-tie antenna, a loop antenna, or another planar antenna. Notably, the receiving antenna does not utilize a costly lens that is utilized in some other systems. The transceiver may also provide a multi-stage power amplifier (e.g. four-stage), phase shifter, buffer amplifier(s), and/or quarter-wave transmission line (TL). The injected signal may be received by the receiving antenna and amplified by a low noise amplifier that is coupled to the receiving antenna. The low noise amplifier may be coupled to the IL-VCO, and the IL-VCO may be coupled to a buffer amplifier. The amplified signal may be injected at the current source of a divider to produce a reference signal. This signal may be amplified and passed through a phase-shifter to enable beam-steering. The phase shifter may provide phase offset adjustments to the locked signal before outputting the locked signal to the transmitting antenna. As discussed in further detail below, an active current-mode phase shifter with quadrature generation network may be implemented, and thus, the divider may separate the signal into I and Q signal paths. The integration of IL-VCO and phase shifter allows for frequency and phase offset adjustment between array elements, enabling efficient power combining. The output signal from of the phase shifter may be amplified by an on-chip power amplifier coupled to the phase shifter, and then coupled to the transmitting antenna.

In nonlimiting examples discussed further herein, 100 GHz was used as the central injection locking frequency. A lower frequency could be used, but at the cost of antenna efficiency. This is because the particular size of the die used prevented resonant antennas with lower frequencies. However, other embodiments may allow for lower frequencies. In the nonlimiting example, the injected signal was received by an on-chip patch antenna and amplified by a low noise amplifier by 2.3 dB. The amplified signal was injected at the current source of a divider to produce a 50 GHz reference signal. This signal was amplified by 12.5 dB and passed through a phase-shifter to enable beam-steering. The output power of the phase shifter is amplified by an on-chip power amplifier to 11 dBm and then radiated through the on-chip dipole antenna.

Figure 4A:
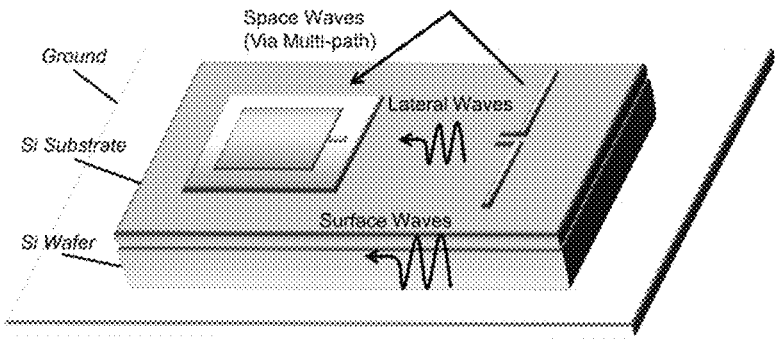
FIGS. 4A-4B respectively show undersired feedback via lateral, surface, and space wave and a schematic of a wireless locking system.
Figure 4B:
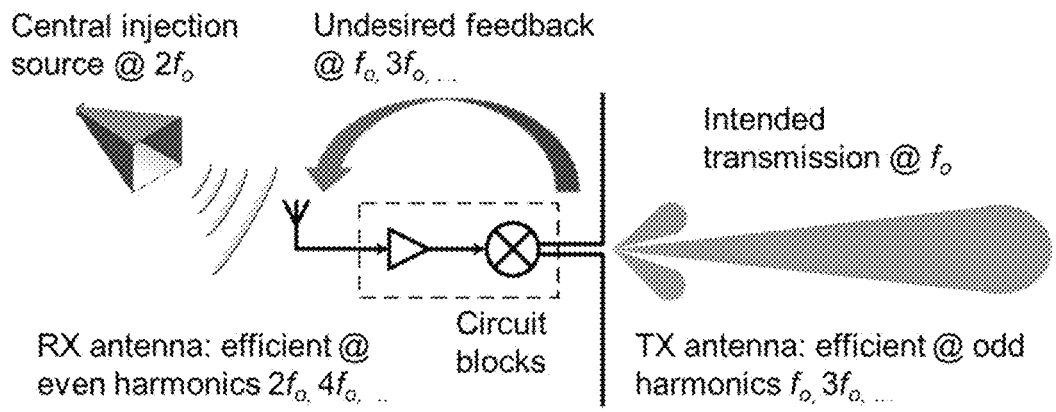

Eliminating Self-Oscillation by Using Orthogonal Antennas in Frequency and Polarization Traditional mm-wave transmitters utilize a silicon lens to collect and radiate the surface wave power. This significantly increases the cost and the complexity of the system. Further, one of the challenges of wireless injection locking with on-chip antennas is the self-oscillation. Self-oscillation happens when the output of the transmitting antenna is coupled to the input of the receiving antenna. If the feedback is strong enough, the receiver locks to its own transmitter instead of the external synchronization signal. FIGS. 4A-4B respectively show undesired feedback via lateral, surface, and space waves, and a design that eliminates self-oscillation.

To eliminate this self-oscillation problem, two methods have been considered that may be utilized separately or together. The first methods previously discussed above utilizes an antenna with an optimized substrate thickness is designed to radiate electromagnetic waves in odd harmonics, whereas the central injection source provides a signal in even harmonics. Due to the interesting properties of the substrate modes, an on-chip dipole antenna radiates efficiently at odd harmonics while suppressing most radiation at even harmonics. It is theorized that this is due to the TE surface waves being out-of-phase with the desired space wave, resulting in near-zero radiation efficiency.

In the second method to eliminate self-oscillation, the unwanted feedback can be mitigated by designing antennas with orthogonal polarization and radiation efficiency. For example, the polarization of the receiver antenna is designed to be orthogonal to the transmitter antenna. FIG. 7 respectively show simulated radiation efficiency of the transmitter dipole antenna (solid) and the receiver patch antennas (dashed). FIG. 7 shows a simulated radiation efficiency of 5% by the patch antenna at 100 GHz. The radiation efficiency of the transmitter dipole antenna is 16% at 50 GHz and 40% at 150 GHz. FIG. 8 shows the reduction in the TX-RX coupling by using antennas that are orthogonal in frequency and polarization.

High radiation efficiency can be achieved by selecting an optimal substrate thickness for a receiving antenna, (e.g. patch or grounded microstrip antenna). At extremely thin substrates ($<<\lambda_0/10$), the radiation efficiency of a microstrip antenna is very low due to the high conductor loss. It is therefore desirable to increase the substrate thickness to be comparable to the wavelength. When the substrate thickness is $>\lambda_0/10$, the radiation efficiency becomes dominated by the surface wave power. According to analysis, The TM surface waves are in phase with the space waves and add constructively to the total radiated power, while the TE surface waves are out-of-phase and reduce the total radiated power. Since the $TM_0$ mode has a cutoff frequency at 0 Hz, the radiation efficiency increases as the substrate thickness increases until it reaches the optimum, which corresponds to the cutoff frequency of the $TE_0$ mode.

Figure 5:
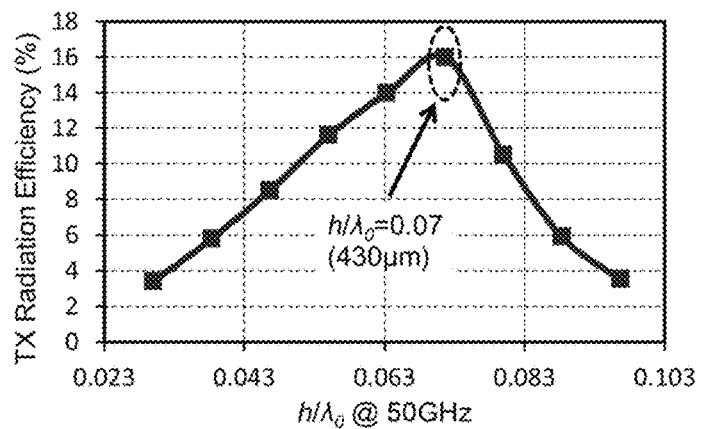
FIG. 5 shows transmitting dipole antenna radiation efficiency vs. $h/\lambda_0$.

As illustrated in FIG. 4A, a wireless injection locking system suffers from multi-path and direct feedback from the TX to the RX antenna. Multi-path feedback is caused by space wave radiation while direct feedback is caused by lateral and surface wave coupling. If the feedback is strong enough, the receiver locks to its own transmitter instead of the external synchronization signal, resulting in an unstable system or injection pulling. A design in which the TX and RX antennas are identical would lead to maximum feedback. The design of the receiver antenna can be important because it is desirable to achieve (a) high radiation efficiency at even harmonics despite the substrate thickness being optimized for odd harmonics, and (b) high isolation from the transmitter antenna to prevent instabilities due to self-locking. This issue is addressed by designing the RX antenna to be orthogonal to the TX antenna in both radiation efficiency and polarization. This is achieved by designing the RX antenna with an $M_1$ ground plane to change its effective substrate thickness. As a nonlimiting example, the ground plate may be utilized to change the effective substrate thickness to 8 μm. In addition, a patch antenna may be used in place of the dipole antenna. Not only does this increase the radiation efficiency by reducing the metal loss due to the electrically thin substrate, but more importantly, it reduces the substrate coupling from the transmitter antenna due to the orthogonal polarization of the electromagnetic fields. In order to find the optimal patch length, Hammerstad's formula was utilized, which states that the frequency of a resonant patch antenna with length L operating in the dominant $TM_{10}$ mode is given by:

$$f_{10} = \frac{c}{\sqrt{\varepsilon_r}} \frac{1}{2(L+\Delta L)} \quad (2)$$

where c is the speed of light, $\varepsilon_r$ is the permittivity of silicon and $\Delta L$ is the length accounting for the fringing effect. In this design $\Delta L$ can be ignored due to the extremely thin effective substrate, and L is chosen to be 750 µm to receive efficiently at 100 GHz. As a nonlimiting example, 2.5D EM simulations using IE3D is used to find the optimal thickness. FIG. 5 shows transmitting dipole antenna radiation efficiency v. $h/\lambda_0$. The optimal thickness is ~430 µm, which is equal to approximately 0.07 wavelengths in air ($\lambda_0$). A dipole antenna is selected as the radiating element due to its small form factor. The transmitter dipole antenna had dimensions of 900 µm by 20 µm and is fabricated using bondpad metal layer due to its low resistivity. The length of the dipole is 900 µm, which is equal to approximately 0.15 wavelengths in air at 50 GHz. The lowest even harmonic was then selected as the wireless injection frequency since there is almost zero space wave transmission at this frequency. Furthermore, a fully-differential topology provides additional filtering of the even harmonics. FIG. 6 shows the simulated impedance of the patch of 57Ω at 100 GHz. As shown in FIG. 7, the TX antenna transmits efficiently at odd harmonics of 50 GHz while the RX antenna receives efficiently at even harmonics, achieving orthogonality and minimum space wave coupling. It should be noted that the TX peaks correspond to the RX valleys and vice versa, resulting in efficient orthogonality. Furthermore, since the E-field of the receiver patch antenna is in the direction of the feed line and perpendicular to that of the transmitter dipole (FIG. 8A), as shown in FIG. 8B illustrating Tx-Rx coupling (dB) vs. Frequency (GHz), lateral and surface wave couplings are significantly reduced. Based on the numerical simulation results reported in FIG. 8B, it is shown that by using a receiving patch antenna instead of a dipole, the isolation is improved by 60 dB at 100 GHz. The proposed TX and RX antenna design reduces surface wave, lateral wave and space wave coupling and therefore minimizes injection pulling and ensures the stability of the system.

IL-VCO and LNA

Figure 9A:
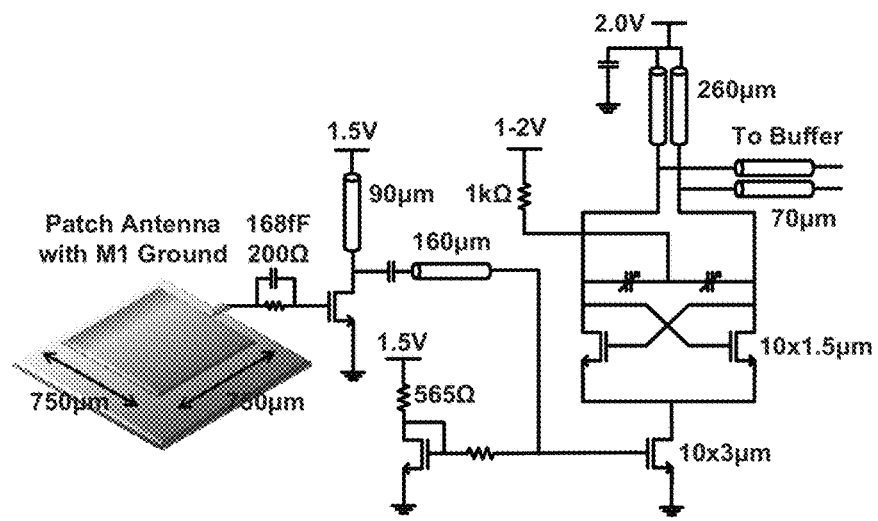
FIG. 9A is a simplified schematic of an injection-locked receiver with an injection-locked VCO (IL-VCO) and LNA.
Figure 9B:
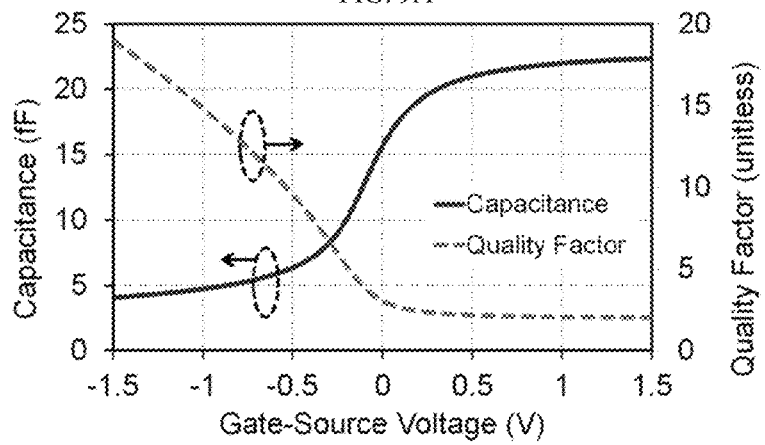
FIG. 9B shows capacitance (fF) and quality factor v. gate source voltage (V)

Due to process, temperature, and voltage (PVT) variations, each chip will have slightly different free-running oscillation frequencies. Incorporating injection locked voltage controlled oscillators (IL-VCOs) can compensate for this difference, enabling coherent power combining. FIG. 9A shows a more detailed illustrative schematic of an IL-VCO and the LNA. It should be understood that the values show are for a nonlimiting illustrative example, and may be modified for other embodiments. The IL-VCO utilizes a cross-coupled negative conductance topology with a tail current source, from which the wireless signal is injected. FIG. 9B shows capacitance (fF) and quality factor v. gate source voltage (V).

Figures 10A, 10B:
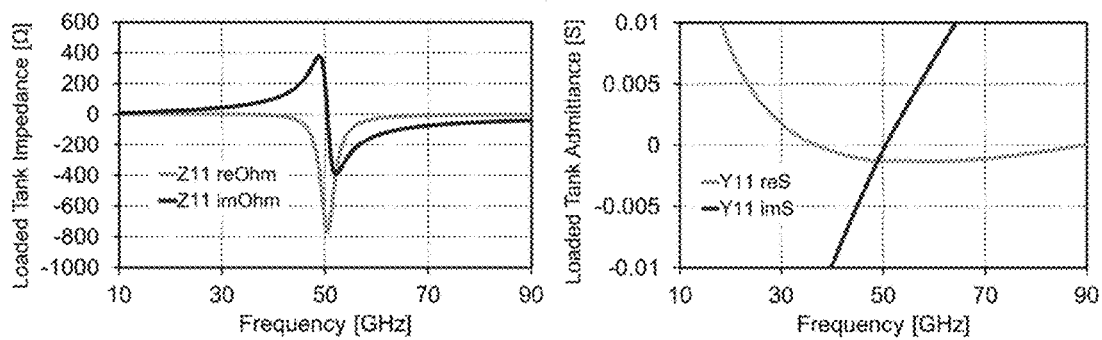
FIGS. 10A-10B respectively show the IL-VCO loaded small-signal tank impedance and admittance vs. frequency;_

As a nonlimiting example, the IL-VCO operates from 51.3 to 52.1 GHz and has an output power of −3.5 dBm. The width of each transistor is 15 µm with 1 µm per finger width. The varactors are implemented by thin-oxide MOS devices that provide an approximate capacitance of 22 fF. The bias can be varied from 1 V to 2 V while the corresponding quality factor varies from 7 to 2. Higher tank Q provides higher output power while lower tank Q increases the locking range. Due to the low quality factor of the MOS varactor at this frequency, the matching network of the subsequent buffer stage is designed to keep the real part of the tank impedance high enough so oscillation can start. FIGS. 10A-10B respectively show the small-signal loaded tank impedance and admittance (e.g. small-signal loaded tank admittance $Y_{tank}$=−0.8 mS (or $Z_{tank}$=−750Ω) at 50 GHz). The negative conductance and the zero susceptance ensure successful oscillation start-up at 50 GHz until the nonlinearity of the large-signal $g_m$ limits the oscillation amplitude. The IL-VCO delivers −3.5 dBm power to the buffer load. To prevent an undesired common-mode oscillation, a 1 kΩ resistor is placed in series with the frequency-tuning node to reduce the common-mode gain.

Figure 11A:
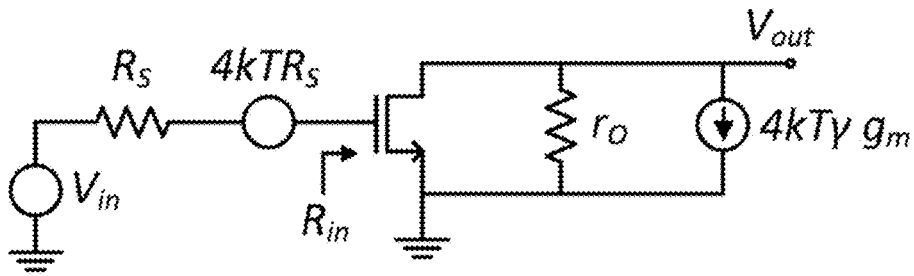
FIG. 11A shows a LNA noise model.

A single-ended LNA is conjugate-matched using stub transmission lines. FIG. 11A shows a LNA noise model that maximizes receiver sensitivity, matches the LNA and antenna impendances for maximum power transfer, and minimizes noise figure (NF) by maximizing device trasnconductance $g_m$.

$$NF = 1 + \frac{4kT\Upsilon g_m r_O^2}{g_m^2 r_O^2 R_{in} / (R_{in} + R_S)} \frac{1}{4kTR_S}$$

$$NF = 1 + \frac{\Upsilon}{g_m(R_S // R_{in})}$$

Figures 11B, 11C:
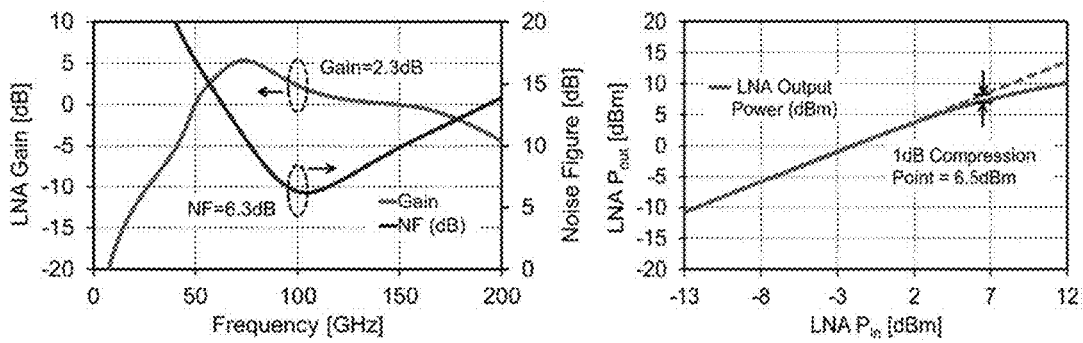
FIGS. 11B-11C respectively show simulated 1-dB compression point (LNA $P_{out}$ vs. LNA $P_{in}$ (both in dBm)), as well as simulated LNA gain (dB) and noise figure (dB) vs. frequency (GHz)

In the nonlimiting example shown, Rs≈50Ω for the resonant patch antenna. The LNA amplifies the 100 GHz wireless signal by 2.3 dB and injects the signal at the current source of the VCO. A resistor is included in the path of the current mirror to form a high impedance path such that the injected power is directed towards the VCO. In order to ensure stability, a parallel RC-network is used in the signal path. This topology acts as a high-pass filter such that the lower frequency signals around the GHz range are attenuated. The simulated noise figure (NF), gain, and linearity are shown in FIGS. 11B-11C. As can be seen from the graphs, the noise figure at 100 GHz is 6.3 dB, and the 1-dB compression point is 6.5 dBm. The simulations sufficient power to lock the transceiver (>>−20 dBm) and enough margin compared to the source used in the experiment (>>0 dBm).

I/Q Generator and Phase Shifter

Figure 12A:
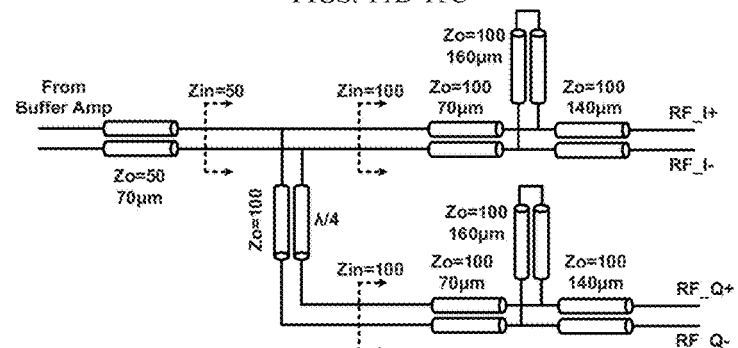
FIGS. 12A-12B respectively show schematics of a quadrature generator with shunt T-matching and an active phase shifter or interpolator.
Figure 12B:
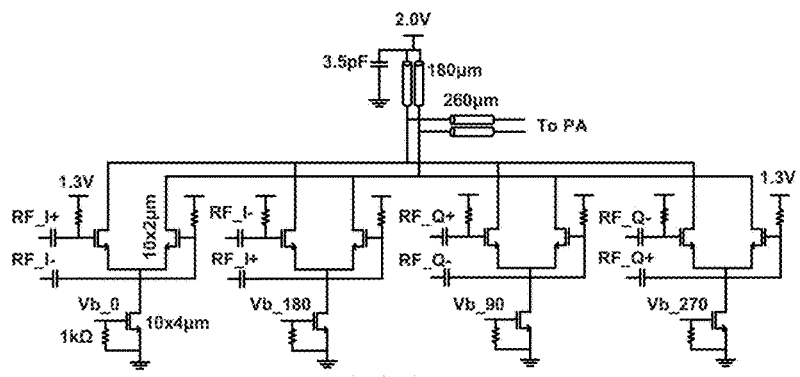
Figure 13:
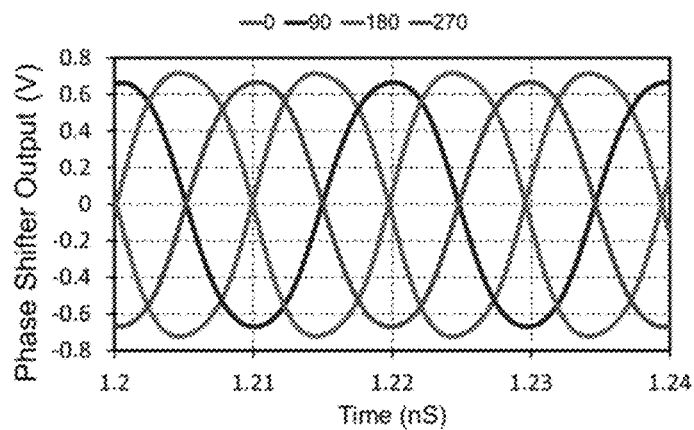
FIG. 13 shows phase shifter output (V) vs. time (nS) to illustrate the output of the phase shifter under locked conditions.

In an injection-locked oscillator, there is a phase difference between the injection signal and the free-running oscillator. In general, the phases of free-running oscillators are random as it is determined by noise, and the phase of the injection signal depends on the distance between the injection source and the chip. To ensure coherent combining at a desired point in space, a phase-shifter in each transmitter is incorporated. For example, in order to provide beam-steering, an active current-mode phase interpolator (e.g. FIG. 12B) with quadrature generation network (e.g. FIG. 12A) may be implemented. An active current-mode phase shifter or active phase interpolator (FIG. 12B) with quadrature generation network (FIG. 12A) is implemented. A quarter-wave transmission line is used to generate the quadrature signal. In order to prevent reflections, both I and Q signal paths are first matched to 100Ω using coupled transmission lines with $Z_O$=100Ω. Then a 50Ω transmission line matches to the previous buffer amplifier, preventing any reflections at the split junction. The quadrature inputs are fed into the phase shifter, which takes the linear combination of the two phases in the current domain. The gain and phase are controlled by the weights of each phase, such as the four input signals that have different phases (0°, 90°, 180°, 270°). The signal is attenuated by 3 dB in this stage, which is compensated by subsequent amplification. Continuous phase-shifting is achieved by tuning analog voltages $Vb_0$, $Vb_{90}$, $Vb_{180}$, and $Vb_{270}$. Compared to passive phase shifters such as a trombone shifter or varactor-loaded transmission line, the implemented active phase shifter consumes less area, provides higher gain and enables continuous phase tuning. The resolution of the phase shifting is limited only by the resolution of the digital-to-analog converter (DAC). The phase simulation showing the output of the phase shifter under locked conditions is shown in FIG. 13. The difference in the magnitude is due to the quarter-wave line and can be compensate by adjusting the bias voltages $Vb_0$, $Vb_{90}$, $Vb_{180}$, and $Vb_{270}$. Due to the extra quarter-wave transmission line for the quadrature path in the I/Q generation network, the Q voltage is attenuated by 0.9 dB.

Power Amplifier

Figures 14A, 14B:
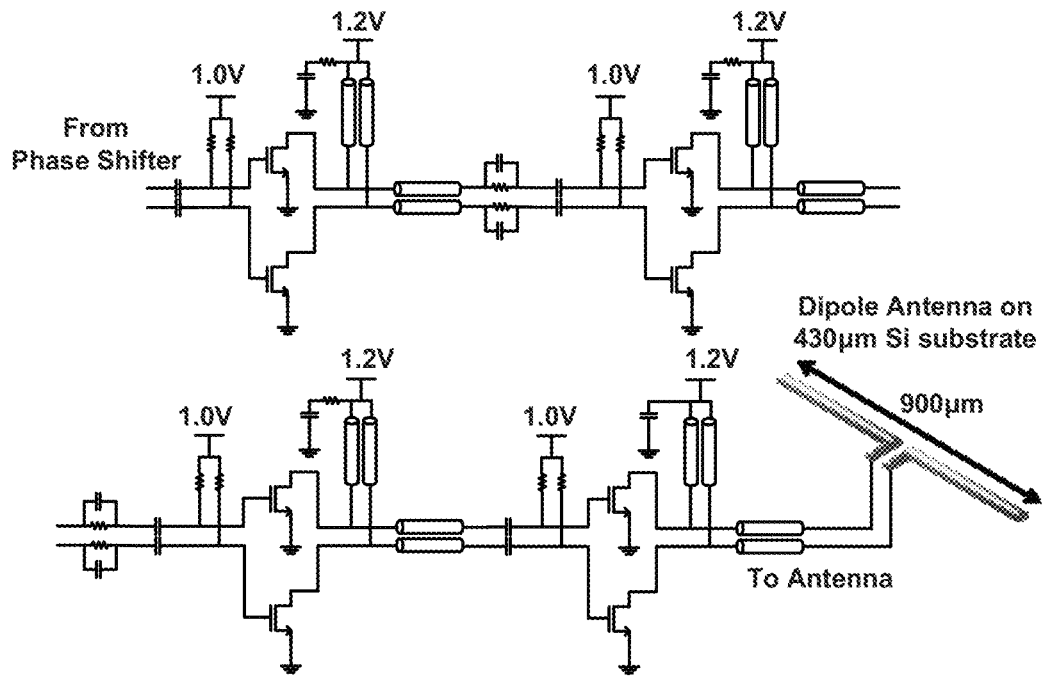
FIGS. 14A-14B are a schematic of a multi-stage power amplifier (e.g. 4 stage) and dipole antenna.

The final stage of the transmitter is the multi-stage amplifier (e.g. four-stage) shown in FIGS. 14A-14B. In some embodiments, inter-stage matching may be provided using differential transmission lines that have side and bottom ground shields. Each stage is matched using a series capacitor, a series transmission line, and a shorted-stub shunt transmission line. The series capacitor and series transmission line rotate around the Smith Chart to the optimal conductance obtained from load-pull simulations, then the shunt transmission line acts as an inductor to tune out the combined susceptance of the load and the transistor source, achieving resonance at 50 GHz. The transistors are progressively sized to provide maximum gain and prevent saturation. Metal-insulator-metal (MIM) capacitors with values of 280 fF act as DC-blocking capacitors to enable independent biasing at each stage. The capacitor has a self-resonant frequency of 120 GHz, which is far above the operating frequency. The quality factor of the capacitor at the operating frequency of 50 GHz is 37.

Figure 15:
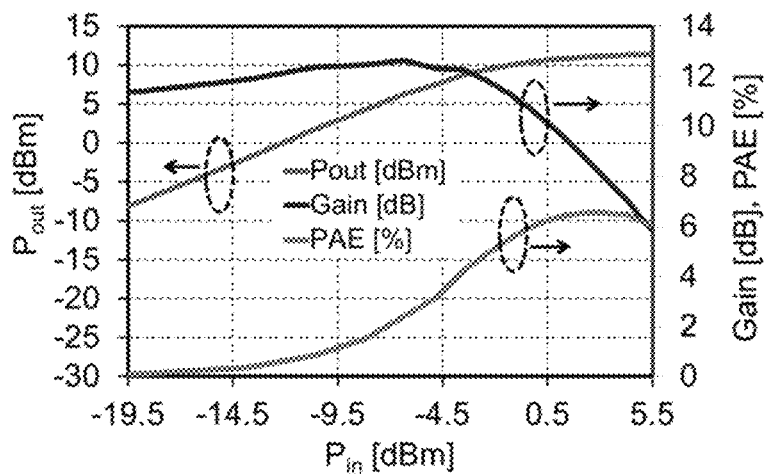
FIG. 15 shows simulated large-signal behavior of a power amplifier, particularly $P_{out}$ (dBm), Gain (dB), and PAE (%) vs. $P_{in}$ (dBm)

Mm-wave amplifiers suffer from severe instability due to the use of high-gain transistors and high-quality factor resonant tanks. At mm-wave frequencies, the PCB traces and wirebonds are comparable to the wavelength, making the on-chip bias nodes non-ideal AC grounds. As a result, the feedback from drain to gate, source to gate or even inter-stage feedback may cause instability. The power amplifier (PA) may be designed with inter-stage matching using coupled transmission line stub structure. In order to improve stability of the high-quality factor resonant structures, several measures are taken. First, a parallel RC tank is placed in series with the signal path. The R and C values are carefully selected to attenuate low GHz frequencies while passing the 50 GHz signal. In addition, instead of using high-Q transmission lines, biasing resistors are used at the gate to reduce the quality factor at that node. Furthermore, each amplifier includes series RC circuits to form a lossy, low-impedance path between bias and ground to reduce the undesired feedback. In this design, each amplifier stage incorporates multiple series RC tanks in parallel to achieve a total of 7.2 pF capacitance. The k-factor of each stage is simulated to ensure unconditional differential and common-mode stability. As shown in FIG. 15, the PA achieves 12.5 dB gain, 11 dBm output power, and 6.5% maximum PAE.

Measurement Results

Single-Chip Wireless Synchronization

The chip was designed and implemented using IBM's 65 nm bulk CMOS technology. The size of the chip including the on-chip antenna and bondpads is 1.7 mm×3.8 mm. The chip micrograph and the measurement setup are respectively shown in FIG. 16A-16B. The chip is thinned to 100 μm to reduce the loss due to the low-resistivity silicon substrate. A high-resistivity silicon wafer with a thickness of 330 μm is attached in between the chip and the PCB ground, producing an effective substrate thickness of 430 μm. The chip consumes a total of 330 mW. Tuning range of the IL-VCO was measured using OML's V-band harmonic mixer and standard-gain horn antenna WR-15 M15RH. The tuning voltage was varied from 0 to 1.6 V, and the observed oscillation frequency ranged from 51.3 to 52.1 GHz, demonstrating a tuning range over 800 MHz. The maximum detectable distance between the chip under test and the receiving horn antenna was 100 cm. No lens was used in this measurement. Accounting for the respective mixer and cable losses of 40 dB and 3.5 dB, the calibrated received power was −51.5 dBm. As a result, radiated power of −5 dBm was calculated using the Friis formula.

Figure 18:
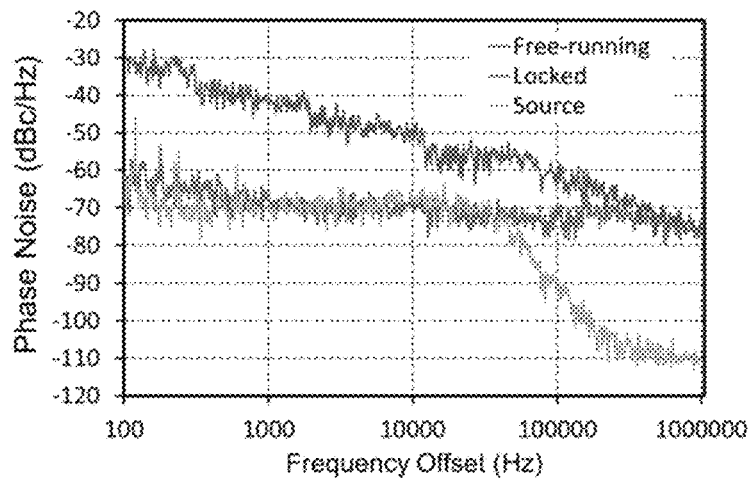
FIG. 18 shows measured phase noise (dBc/Hz) vs. frequency offset (Hz) for a free-running oscillator, locked oscillator, and injection source.
Figure 19:
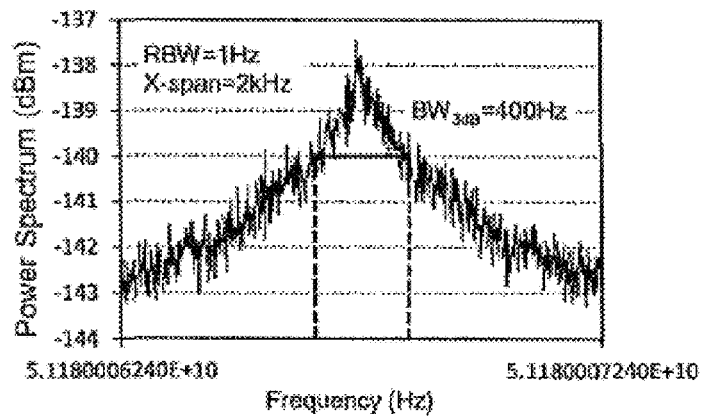
FIG. 19 shows the power spectrum (dBm) v. frequency (Hz), which shows the 3 dB bandwidth of the transmitter is 400 Hz.

In order to demonstrate wireless injection locking, an Anritsu 68369B signal generator was used in conjunction with Millitech's AMC-10-RFHBO×6 multiplier and a W-band, pyramidal horn antenna SGH-10-RO to inject the locking signal to the chip. The output power of the multiplier was 10 dBm. The distance of the horn antenna and the chip was about 5 cm. The simulated gain of the patch antenna at (45°, 0) is −7.7 dBi. From the Friis formula, the received power injected at the IL-VCO is calculated to be −24 dBm. FIG. 17A shows the spectrum of the IL-VCO in the free-running and injection-locked modes; FIG. 17B shows the VCO tuning range; and FIG. 17C shows the VCO injection locking range. Based on this measurement, the 3 dB spectral bandwidth of the locked and unlocked signals are 400 Hz and 500 kHz, respectively. 400 Hz at 50 GHz translates to a frequency stability of 8 ppb. The IL-VCO frequency is exactly half of the injected frequency, demonstrating successful wireless locking. The locking range of the transceiver is >3 MHz. A tuning voltage of the VCO can be varied to increase an effective locking range of the VCO. To further increase the effective locking range, the VCO tuning voltage is varied such that the natural frequency of the VCO gets closer to the injection signal. The injection locking occurs when the difference between the natural frequency of the VCO and the injection signal becomes smaller than the locking range. FIG. 18 shows the phase noise measurements of the free-running transceiver, the locked transceiver, and the signal generator. The phase noise is significantly reduced (40 dB at 100 Hz offset; 23 dB at 1 kHz offset) upon injection of the wireless signal, enabling rapid scaling of the transceiver array. It is shown that the VCO frequency is exactly half of the injected frequency, demonstrating successful wireless locking. Locking range of the transmitter is >3 MHz. FIG. 19 zooms into the signal under the locked state.

Spatial Power Combining Using Wireless Injection Locking

Figure 20:
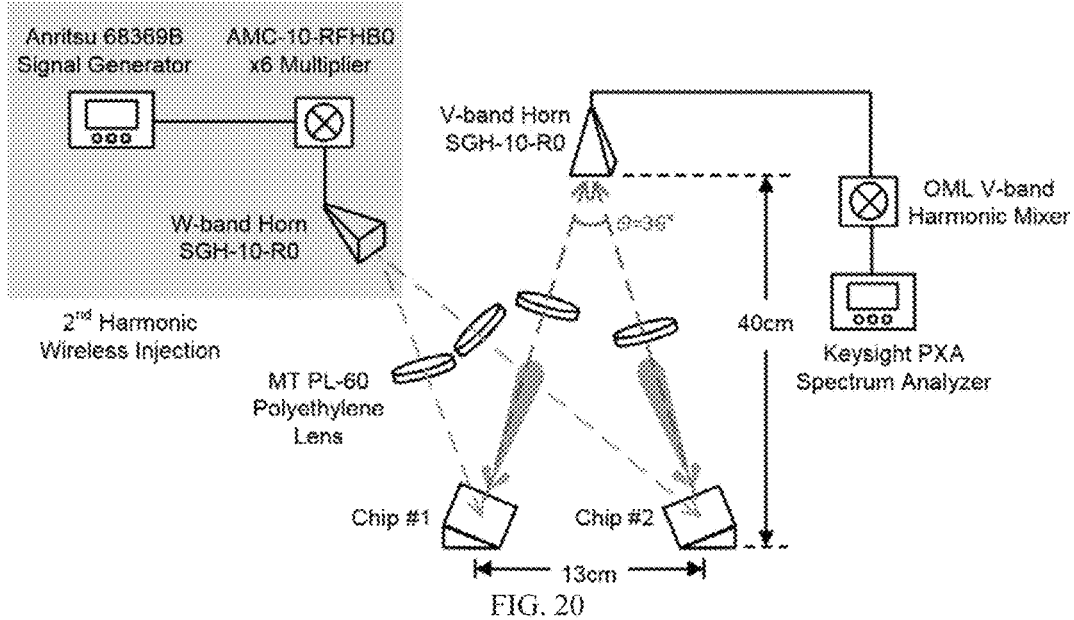
FIG. 20 shows a measurement setup for power combining.
Figures 21A, 21B, 21C:
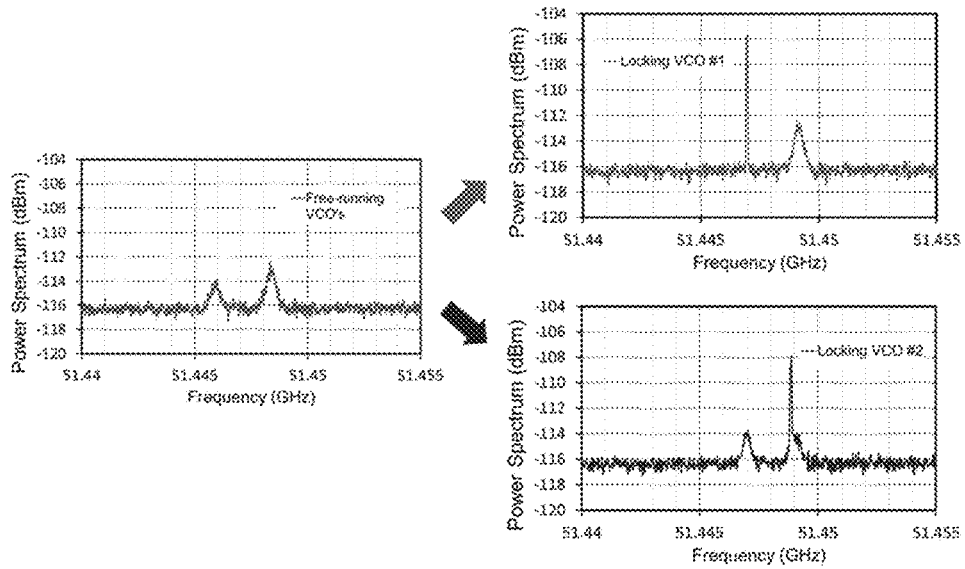
FIGS. 21A-21C respectively show power spectrums (dBm) vs. frequency (GHz) for free-running VCOs, a $1^{st}$ locking VCO, and $2^{nd}$ locking VCO.
Figure 22:
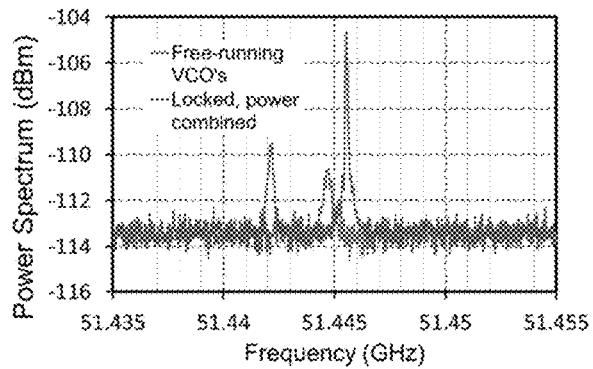
FIG. 22 shows measure power spectrum (dBm) vs. frequency (GHz) of free-running and power-combined signals (RBW=100 kHz)

Upon characterization of the single-chip locking, spatial power combining of two widely-spaced chips using wireless injection locking is demonstrated. The measurement setup is shown in FIG. 20. Due to its high directivity, the horn antenna has to be placed far enough from the radiating chips such that the received power is less affected by the beamwidth. PL-60 lenses are used between each chip and the receiving horn to increase the received power. In a similar fashion, the $2^{nd}$ harmonic wireless injection path also uses two lenses to focus the power towards each chip. As shown in the graph, the two chips are spaced 13 cm apart (~$22\lambda_0$), and the receiving horn antenna is placed 40 cm away from the center point of the two chips. Each chip is placed on an angled platform of 25° in order to direct the transmission power towards the receiving horn. During the experiment, we first tune each IL-VCO such that their free-running frequencies are distinctly apart. Then with the fixed hardware setup, we vary the injection frequency to lock each chip individually. This is shown in FIGS. 21A-21C, where each chip is in turn injection locked. Upon verification of individual locking, we then tune the IL-VCOs such that their free-running frequencies are as close as possible, followed by injection of the wireless signal. FIG. 22 shows the overlaid spectrum of the two free-running VCO's prior to tuning them to be close, and the locked, power-combined signal (RBW=100 kHz). As can be seen, the spectrum sharpened significantly upon injection of the wireless signal, demonstrating successful power combining.

Figures 23A, 23B:
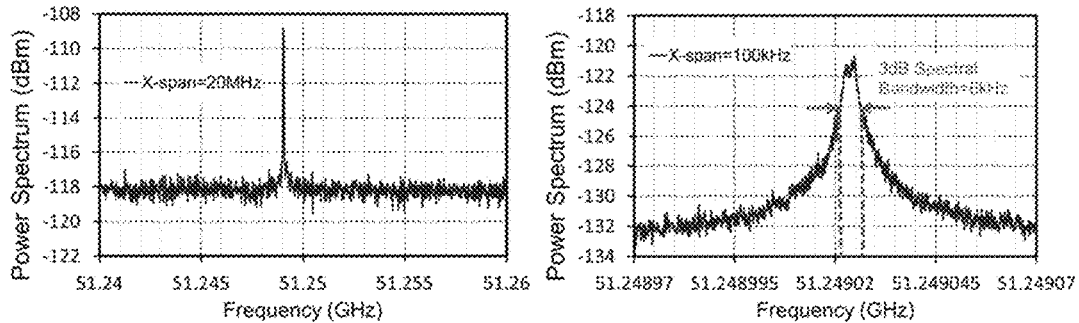
FIGS. 23A-23B respectively show power spectrums (dBm) vs. frequency (GHz) for a combined signal (RBW=33 kHz and 1 kHz)

The combining efficiency can be characterized by measuring the spectral bandwidth. In FIGS. 23A-23B (RBW=33 kHz and 100 kHz), we zoom in to the power-combined signal and measure a 3 dB spectral bandwidth of 6 kHz, equivalent to frequency stability of 120 ppb. In this experiment, the spectral bandwidth is mainly limited by the measurement equipment. Better locking may be achieved by injecting more power or increasing the frequency tuning resolution of the VCO. In addition, other factors such as the phase noise of each chip, power and phase noise of the injected signal, the phase difference between the chips, and the polarization loss between the transmitters and the receiver may also affect the spectral bandwidth of the combined signal.

CONCLUSION

FIG. 24 provides a performance comparison chart. A coherent multi-chip system with widely-spaced elements using wireless injection locking is demonstrated and reported. Wireless injection locking of a single chip results in a 3 dB bandwidth of 400 Hz at a carrier frequency of 50 GHz, or stability of 8 ppb. In addition, spatial power combining using two widely-spaced chips is demonstrated with 3 dB bandwidth of 6 kHz bandwidth. The chip is implemented in IBM's 65 nm bulk CMOS process and occupies an area of 6.5 mm². This sets the foundation for increasing the element spacing of an array through wireless injection locking, extending traditional array systems into the high-resolution, narrow-beamwidth regime. Furthermore, the wireless nature makes the proposed methodology suitable for building an array on non-planar substrates or on mobile platforms.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure.

What is claimed is:

1. A wireless locking system comprising:
   at least one transceiver that comprises
      a receiving antenna that has a first polarization, the receiving antenna configured to receive an injection signal for injection locking an oscillator, wherein the injection signal is received wirelessly;
      a voltage controlled oscillator (VCO) coupled to the receiving antenna, the VCO is configured to injection lock to the injection signal, and the VCO is configured to generate a locked signal with a frequency tone proportional to a frequency of the injection signal; and
      a transmitting antenna having a second polarization orthogonal to the first polarization, wherein the transmitting antenna is configured to transmit the locked signal corresponding to the injection signal;
      the receiving antenna has radiation efficiency peaks at even harmonics of the locked signal, and the transmitting antenna has radiation efficiency peaks at odd harmonics of the locked signal.

2. The system of claim 1, further comprising a phase shifter coupled to the VCO, wherein the phase shifter provide phase offset adjustments to the locked signal before outputting the locked signal to the transmitting antenna.

3. The system of claim 1, wherein the injection signal is an even harmonic of a locked frequency of the locked signal, and a transmission frequency of the locked signal outputted by the transmitting antenna is equal to the locked frequency or an odd harmonic of the locked frequency.

4. The system of claim 1, wherein the wireless locking system provides an array of transceivers that provide power combining, and each transceiver in the array of transceivers comprises an arrangement corresponding to the at least one transceiver.

5. The system of claim 4, wherein the array of transceivers for the wireless locking system have an array spacing that is 100 times a wavelength of the locked signal or greater.

6. The system of claim 4, wherein the array of transceivers for the wireless locking system have an array separation of 100 mm or greater.

7. The system of claim 4, wherein each transceiver from the array of transceivers is provided on distinct regions of a nonplanar substrate that do not share the same plane.

8. The system of claim 4, wherein each transceiver from the array of transceivers is provided on a distinct substrate.

9. The system of claim 8, wherein the distinct substrates are mobile platforms.

10. The system of claim 1, wherein the transceiver operates at frequencies of 1 GHz or greater.

11. The system of claim 1, wherein the receiving antenna or the transmitting antenna is a planar antenna.

12. The system of claim 1, wherein a tuning voltage of the VCO is varied to increase an effective locking range of the VCO.

13. A method for wireless locking comprising:
   providing an injection signal for an array of transceivers, wherein each transceiver of the array of transceivers comprises a receiving antenna with a first polarity, a voltage controlled oscillator (VCO) coupled to the receiving antenna, and a transmitting antenna with a second polarity orthogonal to the receiving antenna;

wirelessly receiving an injection signal by the receiving antennas;

injection locking the VCO of each transceiver of the array of transceivers to the injection signal, wherein the VCO of each transceiver generates a locked signal with frequency tone proportional to the frequency of the injection signal; and transmitting the locked signal from the transmitting antenna of each transceiver of the array of transceivers that corresponds to the injection signal;

wherein the receiving antenna has radiation efficiency peaks at even harmonics of the locked signal, and the transmitting antenna has radiation efficiency peaks at odd harmonics of the locked signal.

14. The method of claim 13, further comprising providing phase offset adjustments to the locked signal before outputting the locked signal to the transmitting antenna.

15. The method of claim 13, wherein the wireless injection signal is an even harmonic of a locked frequency of the locked signal, and a transmission frequency is equal to the locked frequency or an odd harmonic of the locked frequency.

16. The method of claim 13, wherein the array of transceivers for the wireless locking system have an array spacing that is 100 times a wavelength of the locked signal or greater.

17. The method of claim 13, wherein the array of transceivers for the wireless locking system have an array separation of 100 mm or greater.

18. The method of claim 13, wherein each transceiver from the array of transceivers is provided on distinct regions of a nonplanar substrate that do not share the same plane.

19. The method of claim 13, wherein each transceiver from the array of transceivers is provided on a distinct substrate.

20. The method of claim 19, wherein the distinct substrates are mobile platforms.

21. The method of claim 13, wherein the transceiver operates at frequencies of 1 GHz or greater.

22. A method for wireless locking comprising:

providing an injection signal for an array of transceivers, wherein each transceiver of the array of transceivers comprises a receiving antenna with a first polarity, a voltage controlled oscillator (VCO) coupled to the receiving antenna, and a transmitting antenna with a second polarity orthogonal to the receiving antenna;

wirelessly receiving an injection signal by the receiving antennas;

injection locking the VCO of each transceiver of the array of transceivers to the injection signal, wherein the VCO of each transceiver generates a locked signal with frequency tone proportional to the frequency of the injection signal; and transmitting the locked signal from the transmitting antenna of each transceiver of the array of transceivers that corresponds to the injection signal;

wherein each receiving antenna has a radiation efficiency and each transmitting antenna has a radiation efficiency, and the radiation efficiency of the transmitting antenna differs by at least 3 dB from the radiation efficiency of the receiving antenna at harmonics of the locked signal.

23. A wireless locking system comprising:
at least one transceiver that comprises
a receiving antenna that has a first polarization, the receiving antenna configured to receive an injection signal for injection locking an oscillator, wherein the injection signal is received wirelessly;
a voltage controlled oscillator (VCO) coupled to the receiving antenna, the VCO is configured to injection lock to the injection signal, and the VCO is configured to generate a locked signal with a frequency tone proportional to a frequency of the injection signal;
a transmitting antenna having a second polarization orthogonal to the first polarization, wherein the transmitting antenna is configured to transmit the locked signal corresponding to the injection signal;
the transmitting antenna has a radiation efficiency and the receiving antenna a radiation efficiency, and the radiation efficiency of the transmitting antenna differs by at least 3 dB from the radiation efficiency of the receiving antenna at harmonics of the locked signal.

24. A transceiver system comprising:
a substrate of semiconductor material;
a receiving antenna defined on the substrate, the receiving antenna has a first polarization;
a voltage controlled oscillator (VCO) defined on the substrate, the VCO coupled to the receiving antenna, the VCO is configured to injection lock to an injection signal received on the receiving antenna, and the VCO configured to generate a locked signal with a frequency tone proportional to a frequency of the injection signal; and
a transmitting antenna defined on the substrate, the transmitting antenna has a second polarization +/−15° from orthogonal to the first polarization, the transmitting antenna configured to transmit the locked signal corresponding to the insertion signal;
wherein the receiving antenna has radiation efficiency peaks at even harmonics of the locked signal, and the transmitting antenna has radiation efficiency peaks at odd harmonics of the locked signal.

25. A transceiver system comprising:
a substrate of semiconductor material;
a receiving antenna defined on the substrate, the receiving antenna has a first polarization;
a voltage controlled oscillator (VCO) defined on the substrate, the VCO coupled to the receiving antenna, the VCO is configured to infection lock to an injection signal received on the receiving antenna, and the VCO configured to generate a locked signal with a frequency tone proportional to a frequency of the injection signal; and
a transmitting antenna defined on the substrate, the transmitting antenna has a second polarization +/−15° from orthogonal to the first polarization, the transmitting antenna configured to transmit the locked signal corresponding to the injection signal;
wherein the receiving antenna has a radiation efficiency and the transmitting antenna has a radiation efficiency, and the radiation efficiency of the transmitting antenna differs by at least 3 dB from the radiation efficiency of the receiving antenna at harmonics of the locked signal.

* * * * *